United States Patent
Hong et al.

(10) Patent No.: US 10,685,776 B1
(45) Date of Patent: Jun. 16, 2020

(54) INTEGRATED MAGNETIC INDUCTORS

(71) Applicants: Yang-Ki Hong, Tuscaloosa, AL (US); Jaejin Lee, Tuscaloosa, AL (US)

(72) Inventors: Yang-Ki Hong, Tuscaloosa, AL (US); Jaejin Lee, Tuscaloosa, AL (US)

(73) Assignee: The Board of Trustees of the University of Alabama, Tuscaloosa, AL (US)

(*) Notice: Subject to any disclaimer, the term of this patent is extended or adjusted under 35 U.S.C. 154(b) by 191 days.

(21) Appl. No.: 15/477,841

(22) Filed: Apr. 3, 2017

Related U.S. Application Data

(60) Provisional application No. 62/316,757, filed on Apr. 1, 2016.

(51) Int. Cl.
- *H01F 27/28* (2006.01)
- *C22C 45/00* (2006.01)
- *H01F 27/32* (2006.01)
- *H01F 41/02* (2006.01)
- *H01F 10/14* (2006.01)
- *H01L 23/522* (2006.01)
- *H01F 27/25* (2006.01)

(52) U.S. Cl.
CPC ....... *H01F 27/2847* (2013.01); *C22C 45/008* (2013.01); *H01F 10/14* (2013.01); *H01F 27/25* (2013.01); *H01F 27/28* (2013.01); *H01F 27/32* (2013.01); *H01F 41/022* (2013.01); *H01L 23/5227* (2013.01)

(58) Field of Classification Search
CPC ...... H01F 27/2847; H01F 27/25; H01F 27/28; H01F 27/32

USPC ................................................ 336/200, 232
See application file for complete search history.

(56) References Cited

U.S. PATENT DOCUMENTS

| | | | | |
|---|---|---|---|---|
| 5,793,272 A * | 8/1998 | Burghartz | ........... | H01F 17/0006 336/200 |
| 6,417,755 B1 * | 7/2002 | Liu | ...................... | H01F 17/0006 29/602.1 |
| 6,812,543 B2 * | 11/2004 | Kamijima | .............. | B82Y 10/00 257/421 |
| 2004/0263310 A1 * | 12/2004 | Ding | ................... | H01F 17/0006 336/223 |
| 2007/0188287 A1 * | 8/2007 | Lien | ......................... | H01F 3/10 336/200 |
| 2010/0259349 A1 * | 10/2010 | Li | ........................... | H01F 19/04 336/200 |
| 2013/0278374 A1 * | 10/2013 | Thorslund | ........... | H01F 27/2804 336/200 |

(Continued)

FOREIGN PATENT DOCUMENTS

| JP | 06132131 A | * | 5/1994 | |
| JP | 2014183307 A | * | 9/2014 | ......... H01F 17/0013 |

*Primary Examiner* — Tszfung J Chan
(74) *Attorney, Agent, or Firm* — Maynard Cooper & Gale, P.C.; Jon E. Holland

(57) ABSTRACT

An integrated magnetic inductor is provided with an inductor coil, magnetic film, and a substrate. The magnetic film can be placed between the neighboring inductor coils, and the thickness of the magnetic film is greater than the coil thickness. In addition, the magnetic film includes exchange-coupled magnetic materials. The exchange-coupled magnetic materials provide improved permeability and $f_{FMR}$ at the frequency of interest for the integrated magnetic inductor.

19 Claims, 9 Drawing Sheets

(56) References Cited

U.S. PATENT DOCUMENTS

2014/0097930 A1* 4/2014 Yen .................... H01L 23/5227
336/232

* cited by examiner

INTEGRATED MAGNETIC INDUCTORS

CROSS-REFERENCE TO RELATED APPLICATIONS

This application claims the benefit of U.S. Provisional Application No. 62/316,757, entitled "Integrated Magnetic Inductors" and filed on Apr. 1, 2016, which application is hereby incorporated by reference in its entirety.

BACKGROUND

The present application generally relates to integrated magnetic inductors.

Fully integrated radio frequency (RF) devices, including voltage controlled oscillators, low-noise amplifiers, and frequency filters, are used in mobile electronic devices. Typically, integrated RF devices have a large number of inductors that are incorporated into RF integrated circuits (RFICs). The inductors can consume a large area of the RFIC, and the inductors' quality (Q) factors can be important for power management and RF signal processing in the RFIC. Thus, the inductors can have an effect on the performance of the integrated RF device, which can affect the performance of the mobile electronic device incorporating the integrated RF device.

Previously, air core inductors (see e.g., FIG. 1A), for example, microelectromechanical systems (MEMS) and multi-stacked inductors, have been used with RF devices. A MEMS inductor, having a 15 μm thick, 2-turn coil and 40 μm suspension over a silicon (Si) substrate, showed a high Q factor of 27 at 2.6 GHz due to low substrate and ohmic losses. However, the inductor showed a small L-density of 11.2 nH/mm$^2$ (L of 1.8 nH). In contrast, a two-stacked inductor with 9.5 total turns exhibited a high L-density of 283.7 nH/mm$^2$ but a low Q factor of 9.8 at 2.3 GHz. The two-stacked inductor can have a low Q factor because the multi-stacked coil structure causes a large proximity effect and parasitic capacitance.

Instead of an air core inductor, a magnetic inductor can be used with RF devices. The magnetic inductor can use a film of a high permeability material located above the inductor coil (see e.g., FIG. 1B), below the inductor coil (see e.g., FIG. 1C) or both above and below the inductor coil (see e.g., FIG. 1D) to increase the L and Q factor of the inductor by increasing the magnetic flux and decreasing the coil resistance and parasitic capacitance. For example, a 2 μm thick CoZrTa magnetic inductor and a 15 μm thick Ni—Zn—Cu ferrite inductor showed about 28 and 1.1 times increases in L, respectively, compared to that of an air-core inductor. However, the magnetic inductors exhibited lower Q factors than that of the air-core inductor due to magnetic loss of the magnetic materials. Therefore, what is needed is an integrated magnetic inductor that can realize both high L-density and Q factor.

SUMMARY

The present application generally pertains to an integrated magnetic inductor. The inductor can include inductor coil(s), magnetic film(s), and a substrate. The magnetic film(s) can be placed between the neighboring segments of the inductor coil(s), and the thickness of the magnetic film(s) can be greater than the coil thickness. A gap may be present between the magnetic film(s) and the coil(s). In addition, the magnetic film(s) of the inductor includes exchange-coupled magnetic material(s) that have magnetically soft and hard phases. The soft magnetic phase has a higher saturation magnetization ($M_s$) and smaller magnetic anisotropy field ($H_k$) than the $M_s$ and $H_k$ of the hard magnetic phase. By controlling a volume fraction of the hard (or soft) magnetic phase in the exchange-coupled magnetic material, high $M_s$ and large $H_k$ can be achieved.

One advantage of the present application is that high permeability and high ferromagnetic resonance frequency ($f_{FMR}$) can be realized.

Another advantage of the present application is that the structure of the inductor minimizes the effect of magnetic loss of the magnetic materials on the inductor electrical characteristics.

Still another advantage of the present application is that the technology can be applicable to any type of planar integrated inductor regardless of size, coil geometries, and operating frequency.

A further advantage of the present application is an inductor with a small form-factor, low power consumption, and good RF signal processing for the RFICs within electronic devices.

Other features and advantages of the present application will be apparent from the following more detailed description of the identified embodiments, taken in conjunction with the accompanying drawings which show, by way of example, the principles of the application.

BRIEF DESCRIPTION OF THE DRAWINGS

Wherever possible, the same reference numbers are used throughout the drawings to refer to the same or like parts.

DETAILED DESCRIPTION

Figure 2:
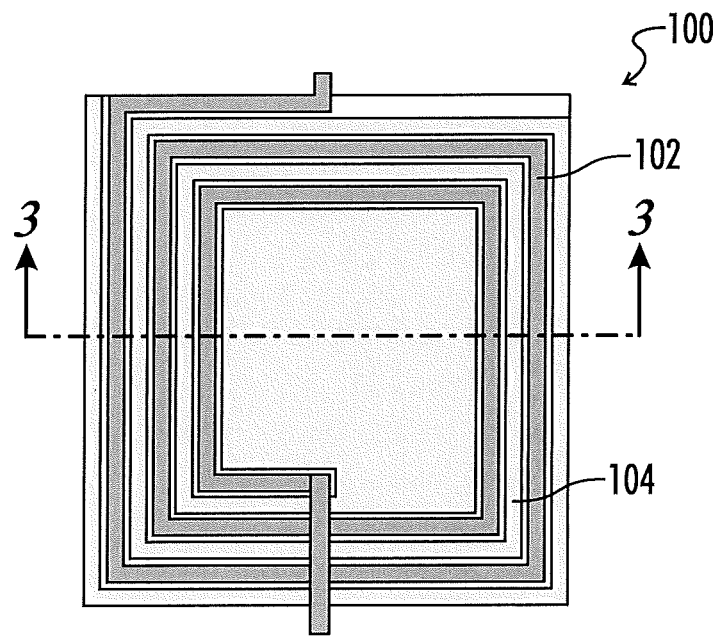
FIG. 2 is a top view of an embodiment of an integrated magnetic inductor.
Figure 3:
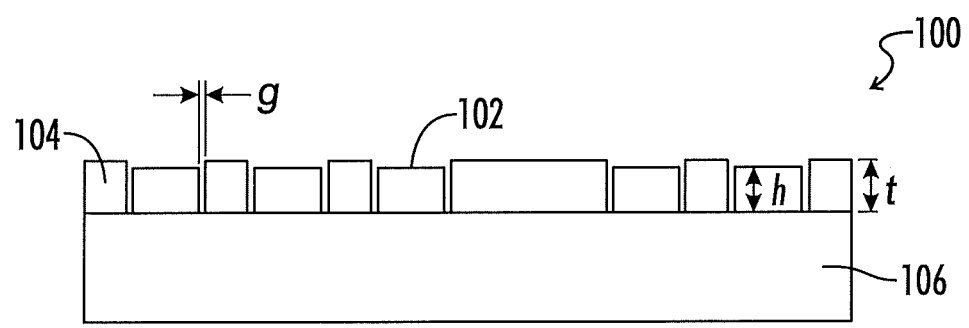
FIG. 3 is a cross-sectional view of the inductor of FIG. 2 taken along line 3-3.

FIGS. 2 and 3 show an embodiment of an integrated magnetic inductor 100. The inductor 100 includes an inductor coil 102 and a magnetic film 104 mounted on a substrate 106. The magnetic film 104 can be located on each side, i.e., on an inner and outer side, of each segment of the inductor coil 102. In addition, as shown in FIG. 2, the magnetic film 104 can also occupy the space at the center of the inductor coil 102. The magnetic film 104 can be spaced a predetermined distance g (see e.g., FIG. 3) from each side of the inductor coil 102. In another embodiment, the magnetic film 104 can be in contact with one or more sides of one or more segments of the inductor coil 102. The magnetic film 104 can have a predetermined thickness t (see e.g., FIG. 3) that is greater than the predetermined thickness h (see e.g., FIG. 3) of the inductor coil 102. In one embodiment, t can be two or more times greater than h, but can be less than two times, e.g., 1.5 times, greater than h. The increased thickness in the magnetic film 104 to be greater than the thickness of the inductor coil 102 contributes to an increase in L due to a reduction in proximity effect and improved magnetic flux density.

In one embodiment, the magnetic film 104 can be made from an exchange-coupled magnetic material(s). The exchange-coupled magnetic material can include magnetically soft and hard phases. The soft magnetic phase has higher saturation magnetization ($M_s$) and smaller magnetic anisotropy field ($H_k$) than the $M_s$ and $H_k$ of the hard magnetic phase. The exchange-coupled magnetic material used in the magnetic film 104 can be in the form of a composite or a film. The soft magnetic phase can include spinel Ni—Zn—Co, Ni—Co, Ni—Zn, Mn—Zn, Ni—Zn—Cu ferrites, $BaZnFe_{10}O_{27}$, $Ba_3ME_2Fe_{24}O_{41}$ (ME=Co, Ni, Zn, Cu), Ni—Fe, Fe—Al—O, Fe—Hf—O, Fe—Sm—O, Co—Fe—Hf—O, Fe—Si—Al, Co—Zr—Ta, Fe—Al—N, Fe—Zr—N, Fe—Co—B, Fe—Co—B—Si, Fe—Co—N, Fe—Si, Ni—Fe—Co, or Fe—Al. The hard magnetic phase includes $CoFe_2O_4$, $BaFe_{12}O_{19}$, $SrFe_{12}O_{19}$, Mn—Bi, Mn—Al, Nd—Fe—B, Sm—Co, Fe—Pt, Sm—Fe—N, Fe—Cr—Co—Mo, Mn—Al—C, Al—Ni—Co, Pt—Co, Sm—Co—Fe—Cu or Fe—Cr—Co.

An example of an exchange-coupled magnetic material that can be used with the present application is described in commonly-assigned U.S. patent application Ser. No. 14/941, 201, entitled "Methods for Manufacturing Core-Shell Exchange Coupled Magnetic Particles" and filed on Nov. 13, 2015, which is incorporated herein by reference. In another embodiment, the exchange-coupled magnetic material can include single-phase ferromagnetic materials, single-phase ferrimagnetic materials and combinations thereof. However, in still other embodiments, other types of exchange-coupled magnetic materials can be used.

Figure 4:
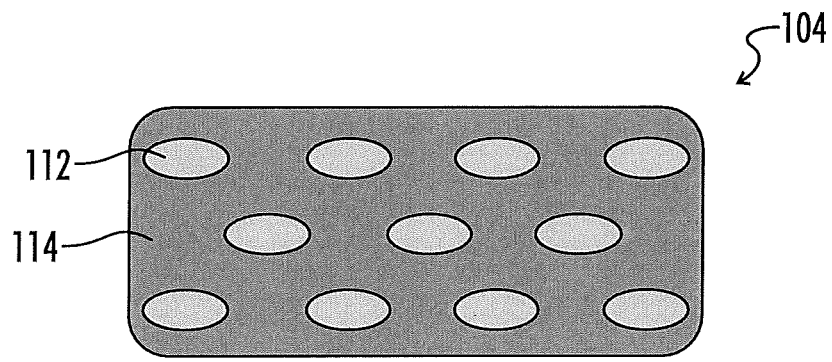
FIGS. 4-6 are cross-sectional views of embodiments of the magnetic film of FIG. 2.
Figure 5:
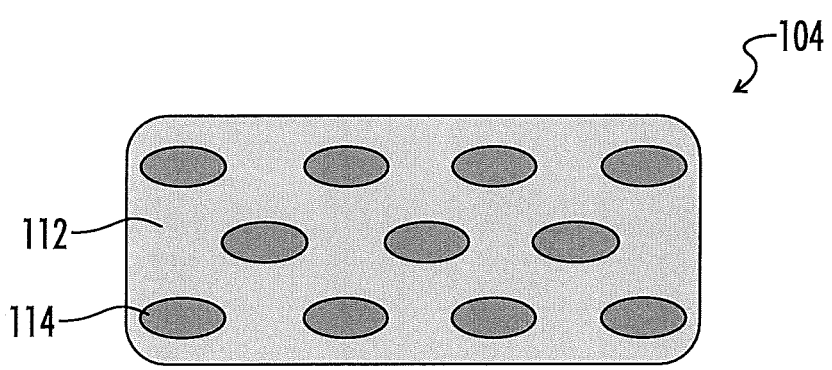
Figure 6:
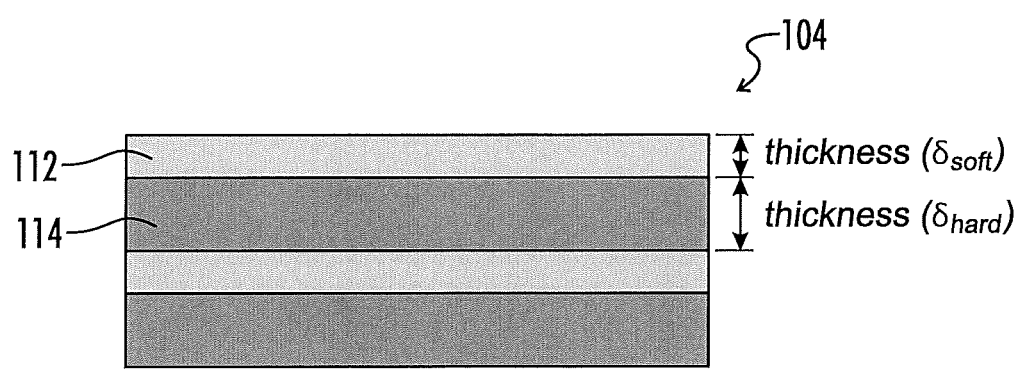

As shown in FIGS. 4 and 5, the exchange-coupled magnetic material can be a composite with a soft magnetic phase material 112 in a matrix of hard magnetic phase material 114 (see e.g., FIG. 4) or a composite with a hard magnetic phase material 114 in a matrix of soft magnetic phase material 112 (see e.g., FIG. 5). Alternatively, as shown in FIG. 6, the exchange-coupled magnetic material can include one or more layers of a soft phase magnetic material 112 on a hard phase magnetic material 114. In one embodiment, the thickness of the hard phase magnetic material $\delta_{hard}$ can be greater than the thickness of the soft phase magnetic material $\delta_{soft}$. However, in other embodiments, the thickness of the hard phase magnetic material $\delta_{hard}$ can be less than or equal to the thickness of the soft phase magnetic material $\delta_{soft}$. By controlling a volume fraction of the hard (or soft) magnetic phase in the exchange-coupled magnetic materials of FIGS. 4-6, high $M_s$ and large $H_k$ can be simultaneously achieved. In one embodiment, the volume fraction can be controllable by the ratio of hard phase (or soft phase) to soft phase (or hard phase) to obtain a desired magnetic characteristic. As an example, a volume fraction of 0.3 indicates that hard and soft phases occupy 30% and 70%, respectively, in an exchange-coupled magnetic material.

Figure 7:
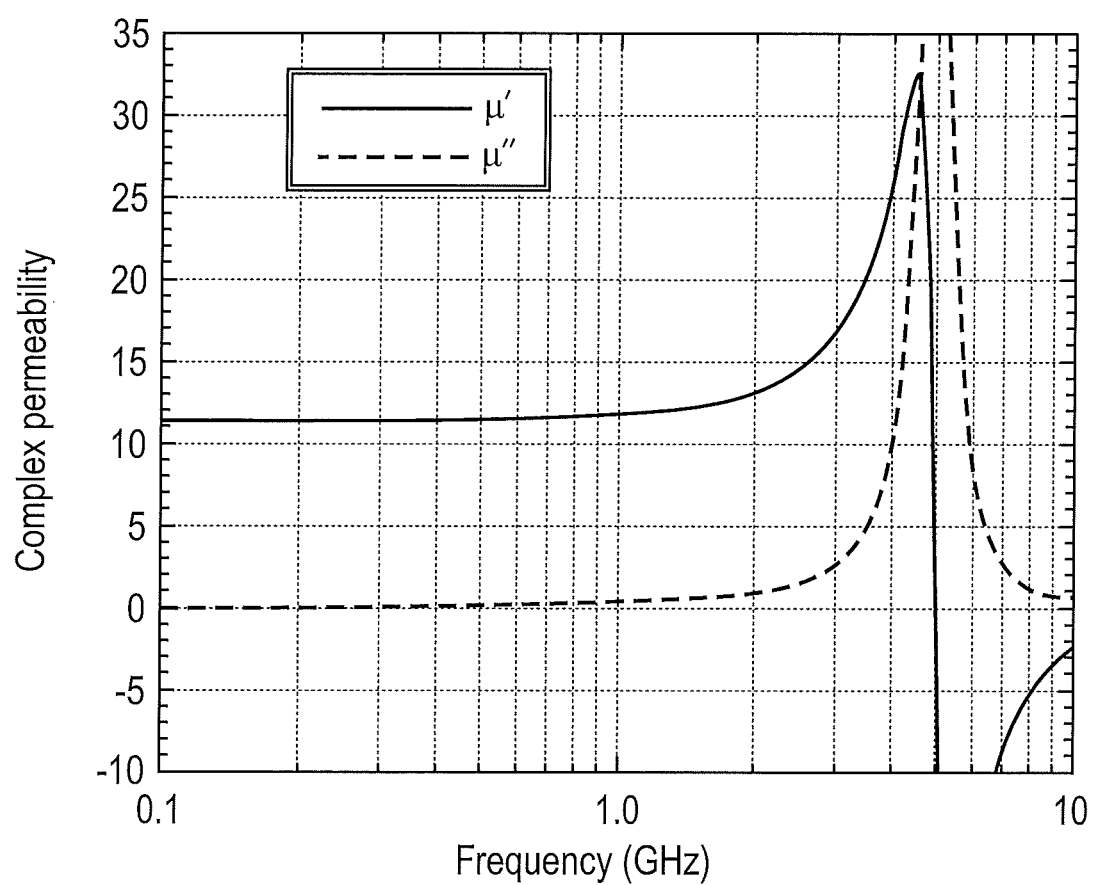
FIG. 7 shows a graph of the complex permeability of the magnetic film in one embodiment.

In one embodiment of the inductor 100, the coil 102 can have 2.5 spiral turns, a coil area of 1×1 mm², a coil width of 50 µm, a space of 50 µm between the coil segments, and a thickness of 7 µm; the substrate 106 can be glass having a $\varepsilon_r$=5.5, a tan $\delta_\varepsilon$=0 and a σ=0 S/m; and the magnetic film 104 can have a thickness of 50 µm, a µ' at 1 GHz of 11.8, a µ' at 2 GHz of 13.3, a loss (tan $\delta_\mu$) at 1 GHz of 0.03 and a loss (tan $\delta_\mu$) at 2 GHz of 0.07. FIG. 7 shows a graph of the complex permeability of the magnetic film 104 in one embodiment. However, in other embodiments, the coil 102 can have a greater or lesser number of spiral turns, a greater or lesser coil area, a greater or lesser coil width, a greater or lesser spacing and a greater or lesser thickness; the substrate 106 can incorporate different materials with different electrical and magnetic properties; and the magnetic film 104 can have a greater or lesser thickness, a greater or lesser µ' and a greater or lesser loss (tan $\delta_\mu$).

Figure 1A:
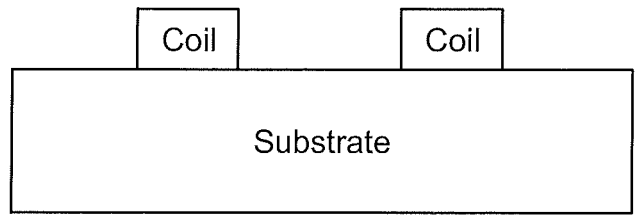
FIGS. 1A-1D show examples of prior art inductors.
Figure 1B:
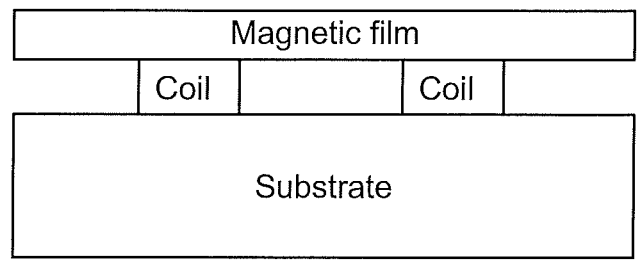
Figure 1C:
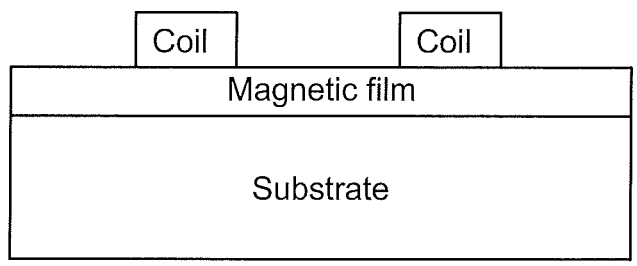
Figure 1D:
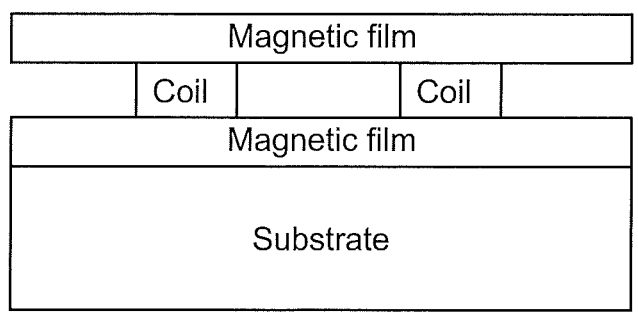
Figure 8:
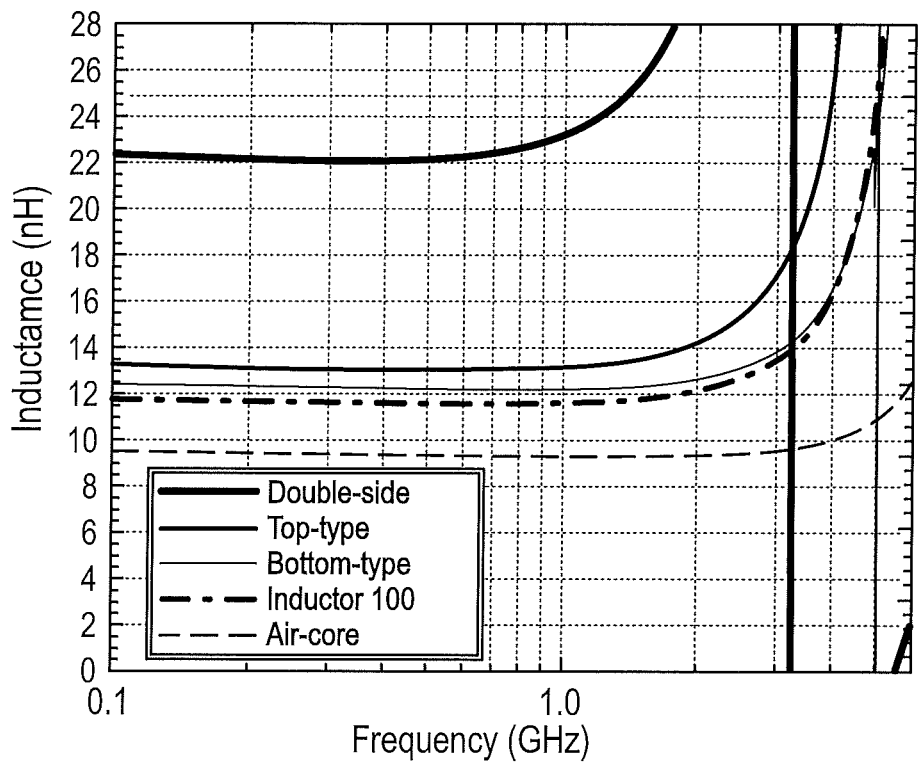
FIGS. 8 and 9 show graphs of inductance and quality factor in terms of frequency for different inductors.
Figure 9:
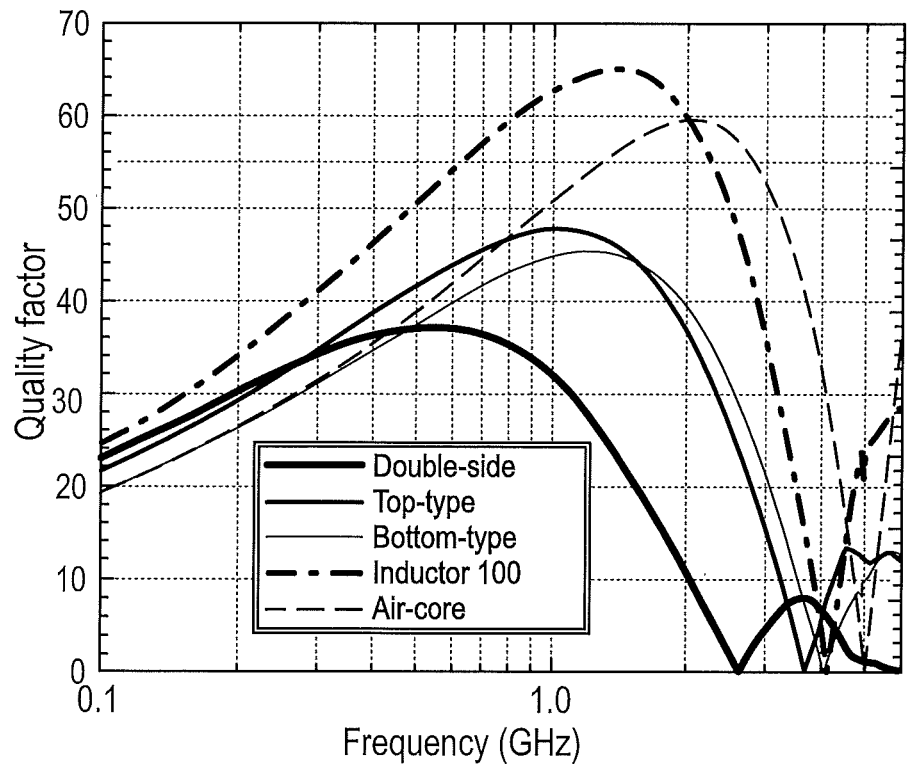

FIGS. 8 and 9 show the simulated (using the ANSYS high frequency structure simulator) L and Q factor of the inductor 100 as compared to the air-core and magnetic inductors of FIGS. 1A-1D. The air-core inductor of FIG. 1A showed L of 9.28 nH and Q factor of 51.26 at 1 GHz. An L at 1 GHz of the double-side inductor of FIG. 1D, the top-type inductor of FIG. 1B, the bottom-type inductor of FIG. 1C, and the inductor 100 is 23.41, 13.19, 12.22, and 11.66 nH, respectively. However, the Q factors at 1 GHz of the double-side inductor of FIG. 1D, the top-type inductor of FIG. 1B, the bottom-type inductor of FIG. 1C are 31.60, 47.81, and 45.00, respectively, which are much lower than 63.15 Q factor at 1 GHz for of the inductor 100. The Q factor for the inductor 100 increased about 23.2% as compared to the air-core inductor of FIG. 1A. The simulated electrical characteristics of the inductors (with comparison to the air-core inductor of FIG. 1A) are summarized in Table 1.

TABLE 1

|  |  | L (nH) at 1 GHz | Q at 1 GHz | Q at 2 GHZ |
|---|---|---|---|---|
| Magnetic | Double-side | 23.47 (+152.3%) | 31.60 (−38.3%) | 10.53 (−82.3%) |
|  | Top-type | 13.19 (+42.1%) | 47.81 (−6.7%) | 36.98 (−38.0%) |
|  | Bottom-type | 12.22 (+31.7%) | 45.00 (−12.2%) | 39.47 (−33.8%) |
|  | Inductor 100 | 11.66 (+25.6%) | 63.15 (+23.2%) | 60.00 (+0.6%) |
| Air-Core |  | 9.28 | 51.26 | 59.66 |

Figure 10:
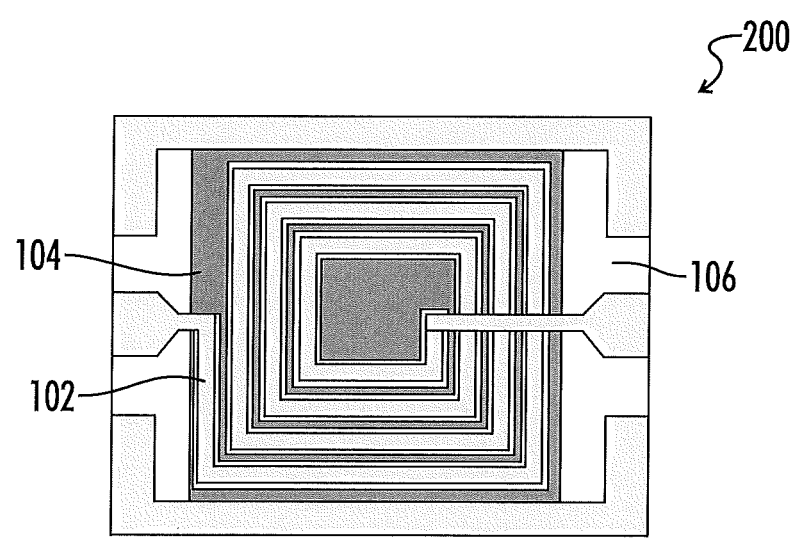
FIG. 10 is a top view of another embodiment of an integrated inductor.
Figure 11:
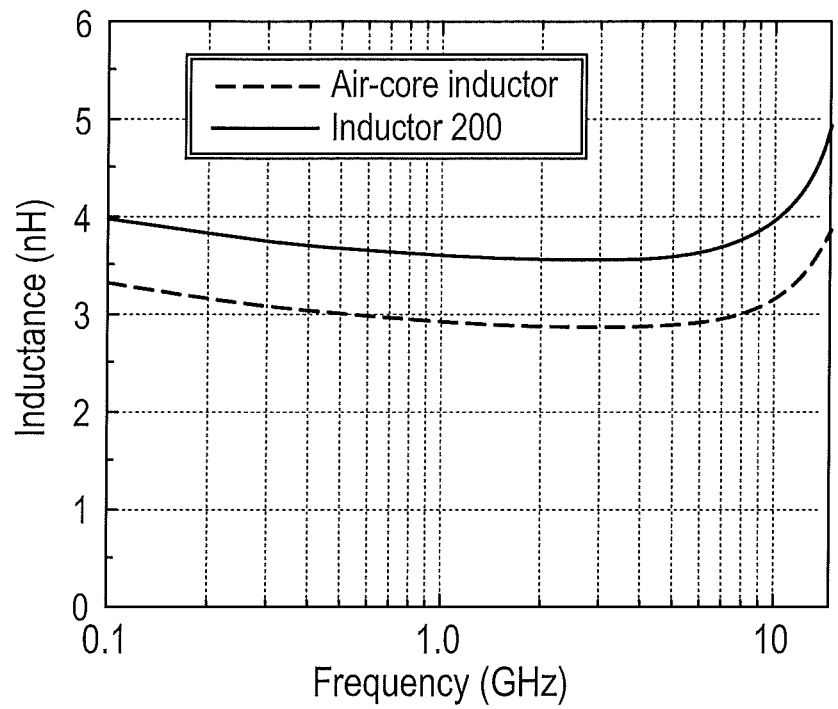
FIGS. 11 and 12 show graphs of inductance and quality factor in terms of frequency for the inductor of FIG. 10 and a similarly configured air-core inductor.
Figure 12:
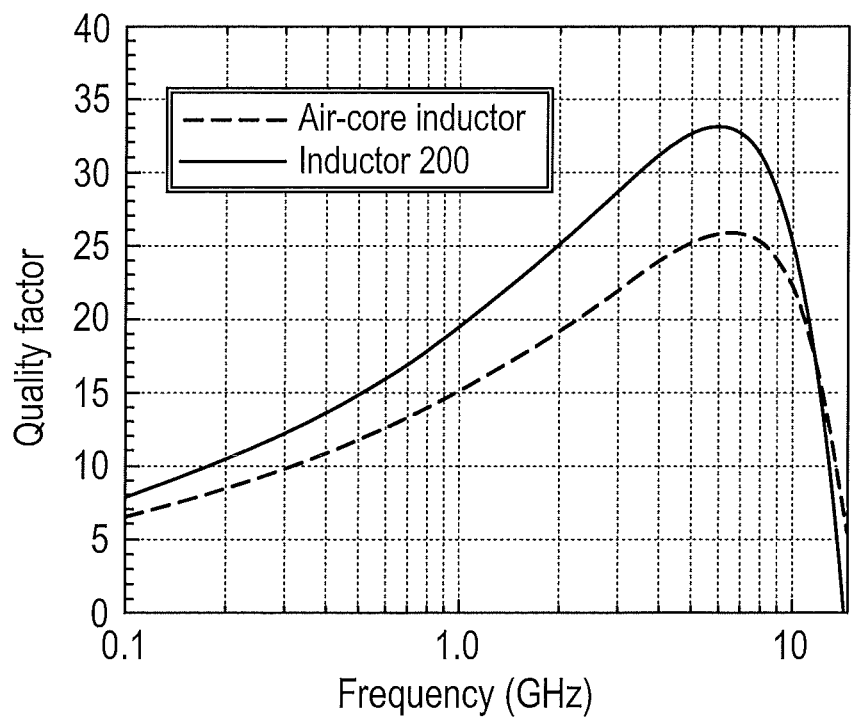

FIG. 10 shows another embodiment of an integrated magnetic inductor 200. In this embodiment, the inductor 200 can have a coil 102 with 3.5 spiral turns, a coil width of 15 µm, space of 15 µm between coil segments, and a coil area of 0.28×0.28 mm², and the substrate 106 can be a GaAs substrate. FIGS. 11 and 12 show the simulated L and Q factor of the inductor 200 and a similarly configured air-core inductor. The L and Q factor at 5 GHz of the inductor 200 are 3.58 nH and 32.7, respectively, which are higher than the L and Q factor at 5 GHz of 2.88 nH and 25.2, respectively, of the air-core inductor. The L and Q factor of the inductor 200 are 24.3% and 29.7% increases as compared to those of the air-core inductor.

Figure 13:
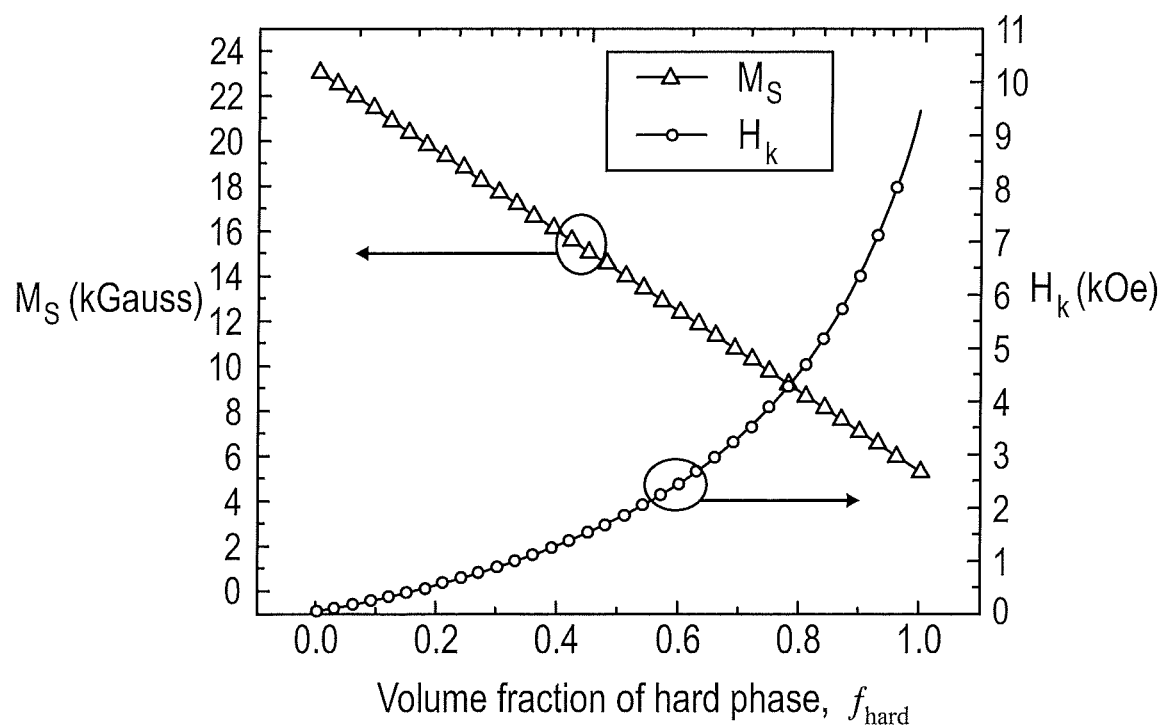
FIG. 13 shows a graph of the calculated $M_s$ and $H_k$ of the exchange-coupled magnetic material in terms of volume fractions of the hard magnetic phase.

In one embodiment, to characterize the magnetic properties of the exchange-coupled magnetic material used in the magnetic film 104, the calculated $M_s$ and $H_k$ of the exchange-coupled magnetic material are shown in FIG. 13 in terms of volume fractions of hard magnetic phase ($f_{hard}$) Equations (1) and (2) were used to calculate $M_s$ and $H_k$.

$$M_s = M_{hard} f_{hard} + M_{soft} f_{soft} \qquad (1)$$

$$H_k = 2\frac{K_{hard}f_{hard} + K_{soft}f_{soft}}{M_{hard}f_{hard} + M_{soft}f_{soft}} = \frac{M_{hard}H_{hard}f_{hard} + M_{soft}H_{soft}f_{soft}}{M_{hard}f_{hard} + M_{soft}f_{soft}} \quad (2)$$

$M_s$ and $H_k$: Saturation magnetization and anisotropy field of the exchange-coupled magnetic material, respectively $M_{soft/hard}$ and $K_{soft/hard}$: Saturation magnetization and anisotropy constant of soft/hard magnetic phases, respectively $H_{soft/hard}$ and $f_{soft/hard}$: Anisotropy field and volume fraction of soft/hard magnetic phases, respectively For example, $CoFe_2O_4$ ferrite and $Fe_{40}Co_{60}$ were used as the magnetic hard and soft phases, respectively, of the exchange-coupled magnetic material. For the single-phase $CoFe_2O_4$, i.e., an $f_{hard}$ of 1, the $M_s$ and $H_k$ are 5,300 Gauss and 9,400 Oe. For the single-phase $Fe_{40}Co_{60}$, i.e., an $f_{hard}$ of 0, the $M_s$ and $H_k$ are 23,000 Gauss and 20 Oe. The calculated results show that both $M_s$ and $H_k$ are controllable with different volume fractions of $f_{hard}$ of the $CoFe_2O_4$, the hard magnetic phase material. The calculated results of $M_s$ and $H_k$ for different $f_{hard}$ are summarized in Table 2.

TABLE 2

| $f_{hard}$ | $M_s$ (Gauss) | $H_k$ (Oe) |
| --- | --- | --- |
| 0 | 23000 | 20 |
| 0.09 | 21407 | 229 |
| 0.12 | 20876 | 305 |
| 1 | 5300 | 9400 |

Figure 14:
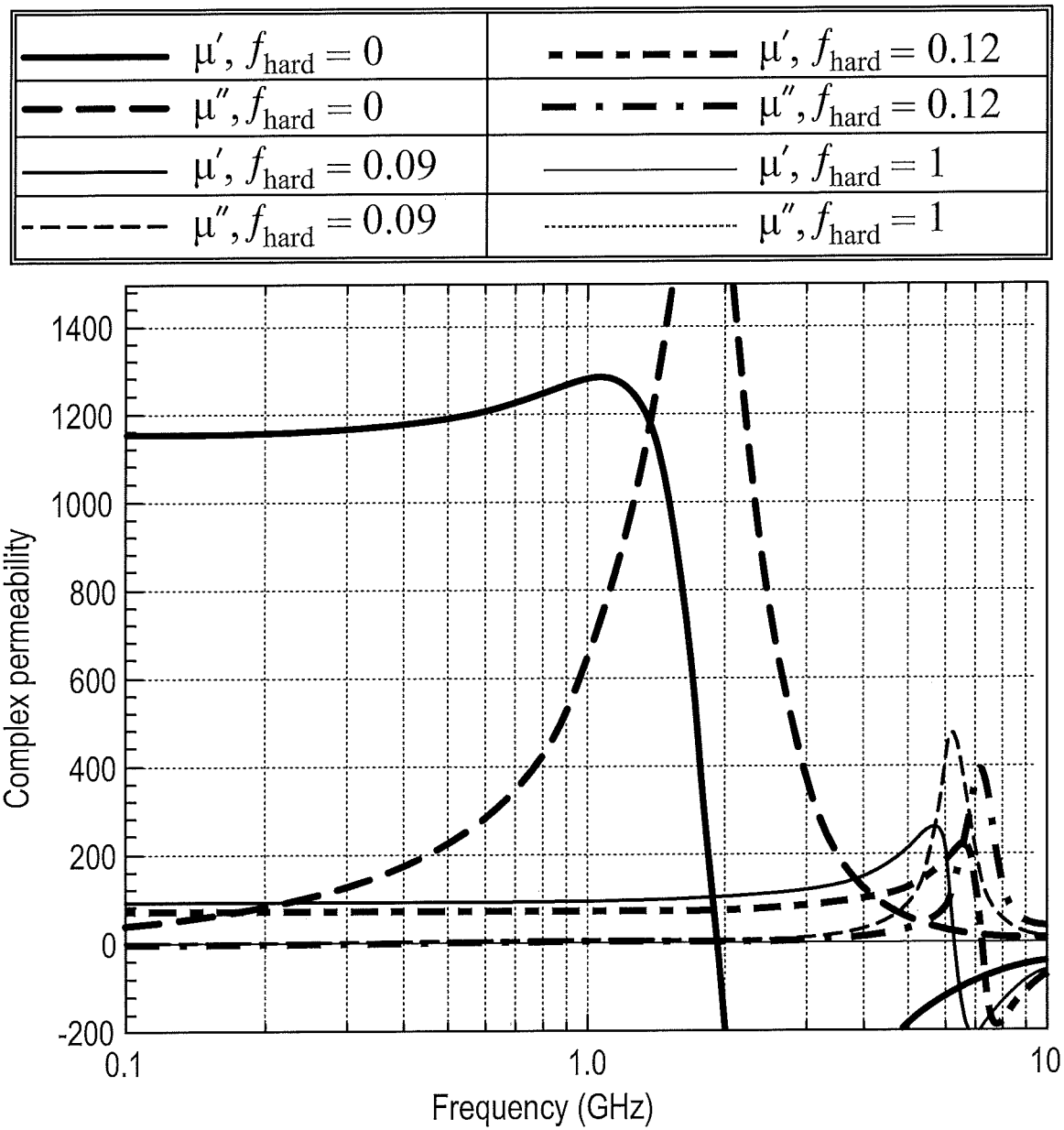
FIG. 14 shows a graph of the calculated complex permeability in terms of frequency for exchange-coupled magnetic materials having different volume fractions of the hard magnetic phase.

The calculated $M_s$ and $H_k$ of the exchange-coupled magnetic material in FIG. 13 can be applied to equation (3) in order to determine the frequency-dependent complex permeability.

$$\mu = \mu' - j\mu'' = 1 + \frac{\gamma 4\pi M_s}{\gamma H_k + j\alpha\omega} \times \left[1 + \frac{\omega^2}{(\gamma H_k + \gamma 4\pi M_s + j\alpha\omega)(\gamma H_k + j\alpha\omega) - \omega^2}\right] \quad (3)$$

where $\mu'$ is the real part and $\mu''$ is the imaginary part of permeability, $\omega$ is the angular driving frequency, $\gamma$ is the gyromagnetic constant (1.76×107 rad/Oe·s), and $\alpha$ is the damping constant FIG. 14 shows the calculated complex permeability of the exchange-coupled magnetic material in terms of $f_{hard}$. As $f_{hard}$ changes from 0 to 1, i.e., the percentage of hard magnetic phase material goes from 0% to 100%, the $\mu'$ varies from 1280 to 1.6, while $f_{FMR}$ increases from 1.8 to 19.7 GHz. The $\mu'$ and $f_{FMR}$ of the exchange-coupled magnetic material are summarized in Table 3.

TABLE 3

| $f_{hard}$ | $\mu'$ at 1 Ghz | $f_{FMR}$ (GHz) |
| --- | --- | --- |
| 0 | 1280 | 1.8 |
| 0.09 | 97 | 6.2 |
| 0.12 | 71 | 7.1 |
| 1 | 1.6 | 19.7 |

It is noted that the $\mu'$ of the exchange-coupled magnetic materials, e.g., $f_{hard}$ of 0.09 or 0.12, is higher than that of the single phase $CoFe_2O_4$, i.e., an $f_{hard}$ of 1, and the $f_{FMR}$ is larger than that of the single phase $Fe_{40}Co_{60}$, i.e., an $f_{hard}$ of 0. Accordingly, the exchange-coupled magnetic material improves the $\mu'$ and $f_{FMR}$ over single phase magnetic materials.

It should be understood that the identified embodiments are offered by way of example only. Other substitutions, modifications, changes and omissions may be made in the design, operating conditions and arrangement of the embodiments without departing from the scope of the present application. Accordingly, the present application is not limited to a particular embodiment, but extends to various modifications that nevertheless fall within the scope of the application. It should also be understood that the phraseology and terminology employed herein is for the purpose of description only and should not be regarded as limiting.

What is claimed is:

1. A magnetic inductor comprising:
a substrate;
a coil mounted on the substrate, the coil having a plurality of segments;
a magnetic film mounted on the substrate between segments of the plurality of segments of the coil, wherein the magnetic film is an exchange-coupled magnetic material comprising a soft magnetic phase material and a hard magnetic phase material; and
wherein the coil has a first thickness and the magnetic film has a second thickness greater than the first thickness.

2. The magnetic inductor of claim 1, wherein the magnetic film is positioned in contact with at least a portion of the coil.

3. The magnetic inductor of claim 1, wherein the exchange-coupled magnetic material has a preselected volume fraction of the hard magnetic phase material to provide a predetermined saturation magnetization and magnetic anisotropy field.

4. The magnetic inductor of claim 1, wherein the soft magnetic phase material includes at least one of spinel Ni—Zn—Co, Ni—Co, Ni—Zn, Mn—Zn, Ni—Zn—Cu ferrites, BaZnFe10O27, Ba3ME2Fe24O41 (ME=Co, Ni, Zn, Cu), Ni—Fe, Fe—Al—O, Fe—Hf—O, Fe—Sm—O, Co—Fe—Hf—O, Fe—Si—Al, Co—Zr—Ta, Fe—Al—N, Fe—Zr—N, Fe—Co—B, Fe—Co—B—Si, Fe—Co—N, Fe—Si, Ni—Fe—Co, or Fe—Al.

5. The magnetic inductor of claim 1, wherein the hard magnetic phase material includes at least one of CoFe2O4, BaFe12O19, SrFe12O19, Mn—Bi, Mn—Al, Nd—Fe—B, Sm—Co, Fe—Pt, Sm—Fe—N, Fe—Cr—Co—Mo, Mn—Al—C, Al—Ni—Co, Pt—Co, Sm—Co—Fe—Cu, or Fe—Cr—Co.

6. The magnetic inductor of claim 1, wherein the exchange-coupled magnetic material comprises a composite of the soft magnetic phase material and the hard magnetic phase material.

7. The magnetic inductor of claim 6, wherein the soft magnetic phase material is in a matrix of the hard magnetic phase material.

8. The magnetic inductor of claim 6, wherein the hard magnetic phase material is in a matrix of the soft magnetic phase material.

9. The magnetic inductor of claim 1, wherein the exchange-coupled magnetic material comprises one or more layers of the soft magnetic phase material and one or more layers of the hard magnetic phase material.

10. The magnetic inductor of claim 9, wherein the one or more layers of the soft magnetic phase material have a thickness less than the one or more layers of the hard magnetic phase material.

11. The magnetic inductor of claim 1, wherein the magnetic film is spaced a predetermined distance from the segments of the plurality of segments of the coil.

12. A magnetic inductor comprising:
a substrate;
a coil mounted on the substrate, the coil having a plurality of segments arranged to form at least one spiral turn;
a magnetic film mounted on the substrate and positioned at an inner side and an outer side of each segment of the plurality of segments of the coil; and
wherein the magnetic film is an exchange-coupled magnetic material comprising a soft magnetic phase material and a hard magnetic phase material.

13. The magnetic inductor of claim 12, wherein the coil has a first thickness and the magnetic film has a second thickness greater than the first thickness.

14. The magnetic inductor of claim 13, wherein the second thickness is at least two times greater than the first thickness.

15. The magnetic inductor of claim 12, wherein the magnetic film is spaced a predetermined distance from both the inner side and the outer side of each segment of the plurality of segments of the coil.

16. The magnetic inductor of claim 12, wherein the exchange-coupled magnetic material comprises a composite of the soft magnetic phase material and the hard magnetic phase material.

17. The magnetic inductor of claim 16, wherein the soft magnetic phase material is in a matrix of the hard magnetic phase material.

18. The magnetic inductor of claim 16, wherein the hard magnetic phase material is in a matrix of the soft magnetic phase material.

19. The magnetic inductor of claim 12, wherein the exchange-coupled magnetic material comprises at least one layer of a soft magnetic phase material positioned on at least one layer of a hard magnetic phase material.

* * * * *